(12) United States Patent
Levert et al.

(10) Patent No.: US 6,407,006 B1
(45) Date of Patent: Jun. 18, 2002

(54) METHOD FOR INTEGRATED CIRCUIT PLANARIZATION

(75) Inventors: Joseph A Levert, Santa Cara; Daniel Lynne Towery, Santa Clara; Denis Endisch, Cupertino, all of CA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 09/549,659

(22) Filed: Apr. 14, 2000

Related U.S. Application Data

(63) Continuation-in-part of application No. 09/392,413, filed on Sep. 9, 1999.

(51) Int. Cl.⁷ .............................................. H01L 21/31
(52) U.S. Cl. ...................... 438/761; 438/762; 438/763; 100/211
(58) Field of Search .................... 438/623, 624, 438/761, 762, 763, 780, 781, 790

(56) References Cited

U.S. PATENT DOCUMENTS

| | | | |
|---|---|---|---|
| 5,736,424 A | 4/1998 | Prybyla et al. | |
| 5,895,263 A | 4/1999 | Carter et al. | 438/624 |
| 5,947,027 A | 9/1999 | Burgin et al. | 101/474 |
| 6,022,812 A | 2/2000 | Smith et al. | 438/761 |
| 6,062,133 A * | 5/2000 | Blalock | 100/211 |
| 6,063,714 A | 5/2000 | Smith et al. | 438/778 |
| 6,121,130 A | 9/2000 | Chua et al. | 438/623 |

FOREIGN PATENT DOCUMENTS

| | | |
|---|---|---|
| WO | WO9848453 A1 | 10/1998 |
| WO | WO9853487 A1 | 11/1998 |
| WO | WO98/4845 | 10/1999 |
| WO | WO98/5348 | 11/1999 |

OTHER PUBLICATIONS

Mezza, P. et al; "Sol–Gel Derived Porous Silica Films"; Journal of Non–Crystalline Solids; Jan. 1, 1999; V243, No. 1, pp. 75–79 (Abstract).

Patent Abstracts of Japan, Publication No. 02125436, Publication Date May 14, 1990, NEC Kagoshima Ltd., Nakano Masahiro.

"Mold–Assisted Nanolithography: A Process for Reliable Pattern Replication", Jan Haisma, et al., J. Vac. Sci. Tech. B 14(6), Nov./Dec. 1996, American Vacuum Society.

Patent Abstracts of Japan, Pubication No. 58105444, Publication Date Jun. 23, 1983, Toppan Printing Co., Ltd., Saito Akihide.

* cited by examiner

*Primary Examiner*—David Nelms
*Assistant Examiner*—Dung A Le
(74) *Attorney, Agent, or Firm*—Roberts & Mercanti, LLP

(57) ABSTRACT

An apparatus for planarizing or patterning a dielectric film on a substrate is provided. The apparatus includes a press for applying contact pressure to an operably connected compression tool. The compression tool has a working face that is planar or patterned. A controller for regulating the position, timing and force applied by the compression tool to the dielectric film is also provided. There is also provided a support, with an optional workpiece holder for supporting the substrate and dielectric film during contact with the compression tool. Methods of using the apparatus, as well as planarized and/or patterned dielectric films are also provided.

23 Claims, 2 Drawing Sheets

METHOD FOR INTEGRATED CIRCUIT PLANARIZATION

STATEMENT OF PRIOR

This patent application is a continuation-in-part of U.S. Ser. No. 09/392,413 filed on Sep. 9, 1999, the disclosure of which is incorporated herein in its entirety.

FIELD OF THE INVENTION

The present invention relates to semiconductor devices, including integrated circuit ("IC") devices. More particularly, it relates to a methods and apparatus for planarizing and/or embossing patterns onto surfaces of semiconductor devices that contain silica dielectric coatings, and particularly nanoporous silica dielectric coatings, as well as to semiconductor devices produced by these methods and apparatus.

BACKGROUND OF THE INVENTION

Processes used for the fabrication of semiconductor devices almost invariably produce surfaces which significantly deviate from a planar configuration. With the trend toward greater large scale integration, this problem is expected to increase. For instance, the production of integrated circuits typically requires multiple layers to be formed sequentially on a semiconductor substrate. Many of these layers are patterned by selective deposition or selective removal of particular regions of each such layer. It is well known that small deviations from the planar, condition in underlying layers become more pronounced with the addition of multiple additional layers of semiconductor and circuit features. Non-planar substrate surfaces can cause many problems that adversely impact the yield of finished products. For example, variations in interlevel dielectric thickness can result in failure to open vias, poor adhesion to underlying materials, step coverage, undesirable bends or turns in conductive metal layers, as well as "depth-of-focus" problems for optical lithography.

In order to effectively fabricate multiple layers of interconnects it has become necessary to globally planarize the surface of certain layers during the multi-step process. Planarizing smoothes or levels the topography of microelectronic device layers in order to properly pattern the increasingly complex integrated circuits. IC features produced using optical or other lithographic techniques require regional and global dielectric planarization where the lithographic depth of focus is extremely limited, i.e., at 0.35 $\mu$m and below. As used herein, the term "local planarization" refers to a condition wherein the film is planar or flat over a distance of 0 to about 5 linear micrometers. "Regional planarization" refers to a condition wherein the film is planar or flat over a distance of about 5 to about 50 linear micrometers. "Global planarization" refers to a condition wherein the film is planar or flat over a distance of about 50 to about 1000 linear micrometers. Without sufficient regional and global planarization, the lack of depth of focus will manifest itself as a limited lithographic processing window.

One previously employed method of planarization is the etch-back technique. In that process, a material, i.e., a planarizing material, is deposited on a surface in a manner adapted to form a surface relatively free of topography. If the device layer and the overlying material layer have approximately the same etch rate, etching proceeds through the planarizing material and into the device layer with the surface configuration of the planarizing layer being transferred to the device material surface. Although this technique has been adequate for some applications where a modest degree of planarity is required, present planarizng materials and present methods for depositing the planarizing material are often inadequate to furnish the necessary planar surface for demanding applications such as in submicron device fabrication.

The degree of planarization is defined as the difference between the depth of the topography on the device surface $h_t$, and the vertical distance between a high point and a low point on the overlying material surface $h_d$, divided by the depth of the topography on the device surface $h_t$:

$$\frac{h_t - h_d}{h_t}$$

The degree of planarization, in percent, is $$\frac{h_t - h_d}{h_t} \times 100$$

Generally, for typical device configurations, planarization using the etch-back technique has not been better than approximately 55% as calculated by the method described above for features greater than 300 microns in width. The low degree planarization achieved by this technique is attributed to a lack of planarity in the planarizing material. Thus, for elongated gap-type features greater than 300 microns in width and 0.5 microns in depth, the usefulness of an etch-back technique has been limited.

U.S. Pat. No. 5,736,424, incorporated herein by reference in its entirety, describes a method for planarizing surfaces of substrates, such as semiconductor materials, by adding a pressing step to an etch-back process. In this reference, an optically flat surface is impressed on a curable viscous polymer coating on the substrate surface in need of planarization, followed by polymerization of the coating. The polymer is selected to etch at the same rate as the surface in need of planarization, and the polymer coating is etched down to the substrate, which is planarized by the process. While an improved planarization is claimed, apparently by starting the etch-back with a flatter surface, an added process step and complexity is required. In addition, this reference fails to provide a solution for planarizing substrates coated with nanoporous dielectric films, since by their nature, such low density films cannot be etched at the same rate as the underlying substrate.

Chemical mechanical polishing (CMP) is another known method that has been effectively used in the art to globally planarize the entire surface of dielectric layers. According to this method, a grainy chemical composition or slurry is applied to a polishing pad and is used to polish a surface until a desired degree of planarity is achieved. CMP can rapidly remove elevated topographical features without significantly thinning flat areas. However, CMP does require a high degree of process control to obtain the desired results.

Dielectric films formed of organic polymers, such as polyarylene ether and/or fluorinated polyarylene ether polymers, have been planarized by applying CMP to a partially cured film, followed by a final curing, as described in co-owned U.S. Ser. No. 09/023,415, filed on Feb. 13, 1998, the disclosure of which is incorporated by reference herein in its entirety. However, this reference fails to disclose how to planarize a silicon-based nanoporous dielectric material on the surface of a substrate.

Further, these previous methods are inadequate for providing localized planarization on different areas of a substrate surface, or for embossing other types of topography onto specific portions of a substrate surface. This is particularly important as the move towards ever larger integrated surface devices requires multiple planar surfaces, vias, trenches and the like, on disparate portions of a single substrate.

In addition, as IC feature sizes approach 0.25 µm and below, problems with interconnect RC delay, power consumption and signal cross-talk have become increasingly difficult to resolve. The integration of low dielectric constant materials for interlevel dielectric (ILD) and intermetal dielectric (IMD) applications, is helping to solve these problems. One type of such low dielectric constant materials are nanoporous films prepared from silica, i.e., silicon-based materials. When air, with a dielectric constant of 1, is introduced into a suitable silica material having a nanometer-scale pore structure, dielectric films with relatively low dielectric constants ("k"), e.g., 3.8 or less, can be prepared on substrates, such as silicon wafers, suitable for fabricating integrated circuits.

There is also a need in the art to pattern the surfaces of potential microelectronic device s or integrated circuits. A number of such methods are known, and include photolithography, electron-beam lithography, and x-ray lithography. With electron-beam lithography, the beam is rastered across the surface of the article to produce the pattern. This is a slow, expensive process. Other previous methods for patterning include a method and apparatus for micro-contact printing that requires complex control mechanisms to keep the print head parallel with the dielectric surface, as disclosed, eg., by U.S. Pat. No. 5,947,027. Given the complexity of the apparatus and methods described by the '027 patent, there remains a need in the art for a reliable and economic method of patterning on the surface of a dielectric film on a substrate.

For all of these reasons, there remains a need in the art for improved methods and apparatus for achieving the planarization and/or patterning of dielectric films, including silica-type dielectric films, on substrates. There is a particular need for such methods and apparatus for planarizing and/or embossing patterns onto nanoporous silica dielectric films.

SUMMARY OF THE INVENTION

In order to solve the above mentioned problems and to provide other improvements, the invention provides novel methods for effectively embossing planarized or patterned surfaces on polymer films. Films to be embossed by the methods and apparatus of the invention preferably include dielectric films suitable for use in microelectronic devices, such as integrated circuits. More preferably, the films to be treated are nanoporous silica dielectric films with a low dielectric constant ("k"), e.g., typically ranging from about 1.5 to about 3.8. The invention is also contemplated to include compositions produced by these methods. In one preferred embodiment, such compositions include films having surfaces that do not deviate from a planar topography by more than 0.35µ, and having a degree of planarization of at least 55%, or greater.

Nanoporous silica films can be fabricated by using a mixture of a solvent composition and a silicon-based dielectric precursor, e.g., a liquid material suitable for use as a spin-on-glass ("SOG") material, which is deposited onto a wafer by conventional methods of spin-coating, dip-coating, etc., and/or by chemical vapor deposition and related methods, as mentioned in detail above. The silica precursor is polymerized by chemical and/or thermal methods until it forms a gel. Further processing by solvent exchange, heating, electron beam, ion beam, ultraviolet radiation, ionizing radiation and/or other similar methods that result in curing and hardening of the applied film.

At an appropriate point in the process, the applied film is contacted with a planarization object, also art-known as a compression tool. This is, for example, an object with a flat surface, or other type of surface suitable for the purpose. The planarization object and film are brought together with a force sufficient to effectively flatten the surface of the film, and thereafter the planarization object is separated from contact with the dielectric film, and any remaining process steps are conducted to produce a hardened nanoporous dielectric silica film. In certain optional embodiments, the gelling or aging step is skipped, and the planar surface or pattern is transferred to the dielectric film, and then heat cured, during or after contact with the working face of the planarization tool.

Apparatus for planarizing or patterning a dielectric film on a substrate broadly includes:

(a) a press for applying contact pressure to a planarization object, i.e., a compression tool, (b) a compression tool having a working face that is planar or patterned, wherein said compression tool is operably connected to the press, (c) a controller for regulating the position, timing and force applied to the dielectric film, (d) a support for the substrate while said dielectric film is contacted by the compression tool.

The press for applying the compression tool can be any suitable art-known mechanical, hydraulic or gas-operated press device, for example, an arbor press, a hydraulic press, a pneumatic press, a moving cross-head press and variations and/or combinations thereof.

The support is any suitable device for fixing the substrate in place during the compression process, and optionally includes a workpiece holder, such as a vacuum chuck, or mechanical clamp(s) or other positioning devices, for maintaining the position and alignment of the substrate.

The compression tool is, i.e., a planarization object, and can be any suitable art-known device, for example, an optical flat, an object with a planar working surface, an object with a patterned working surface, a cylindrical object with a working surface that will emboss a dielectric film when said cylindrical object is rolled over said dielectric film, and combinations thereof Of course, such a compression tool has a working face that is capable of transferring a planar or patterned impression to the film to be impressed.

In a preferred embodiment, the compression tool is constructed to have at least one vent for transporting vapors or gases to or from the working face of the compression tool compression. For example, the vent preferably includes at least one opening on the working surface of the compression tool, so that the vent connects to a conduit through said compression tool for removing vapors or gases from the impressed film and/or for contacting the film with gas or vapor phase reagents during the impression step. When removing vapors or gases, the conduit connects to atmosphere or to a gas or vapor collection system. In one preferred variation, the conduit can be optionally connected to a source of pressurized gas or air, in order that a flow of gas can be directed to the working surface of the compression tool, to facilitate separation of the compression tool from the impressed film.

In a further preferred embodiment, the vent is a system that includes one or more purge inlets opening on the working face of the compression tool and passing completely through the compression tool, that operably connects to one or more purge channels running along the working face of said compression tool, that are operably connected to purge inlets. As for the vent and conduit described above, the purge inlets are optionally operably connected to a gas or vapor collection system and/or source of pressurized gas.

In another preferred embodiment, the support includes a compliant support that is formed using any suitable compliant material. Simply by way of example, such a compliant support can be formed from a compressible polymer, a compressible copolymer, a viscous material, a polymer bladder filled with a pressure regulated hydraulic fluid, and combinations thereof. The workpiece holder can optionally include a vacuum chuck for holding the substrate in a fixed position during compression.

The invention also includes a method of planarizing or patterning a dielectric film on a substrate that includes the steps of (a) applying a dielectric film precursor to a substrate;

(b) planarizing or patterning said dielectric film in the apparatus of claim 1;

(c) gelling said dielectric film before, during or after step (b);

(d) curing the dielectric film.

The invention further includes a dielectric film on a substrate that is planarized or patterned by any of the above-described methods and/or apparatus. Further still, the invention includes a substantially planarized nanoporous dielectric silica coating on a substrate formed by a process comprising: applying a composition that comprises a silicon-based precursor onto a substrate to form a coating on said substrate, and conducting the following steps:

(a) optionally gelling or aging the applied coating, (b) contacting the coating with a planarization object, i.e., a compression tool, with sufficient pressure to transfer an impression of the object to the coating, (c) separating the planarized coating from the planarization object, (d) curing the planarized coating;

wherein steps (a)–(d) are conducted in a sequence selected from the group consisting of (a), (b), (c) and (d);

(a), (d), (b) and (c);

(b), (a), (d) and (c);

(b), (a), (c) and (d); and (b), (c), (a) and (d).

It should be noted that when the above process is applied to a nanoporous silica dielectric film, step (b) is conducted with sufficient pressure to transfer an impression of the object to the coating, without substantially impairing formation of the nanometer-scale pores required to achieve a desirably low dielectric constant in the film.

DETAILED DESCRIPTION OF THE PREFERRED EMBODIMENT

Figure 1:
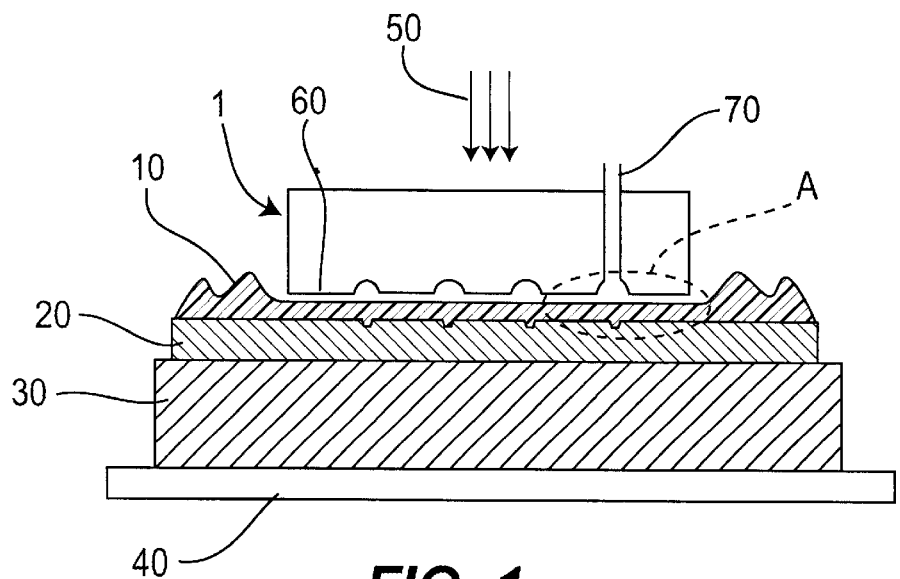
FIG. 1 illustrates a dielectric film coating on a substrate positioned between a compression tool (i.e., a planarization object) and a compliant support, wherein the compression tool is equipped with a purge inlet.

Accordingly, methods and apparatus for planarizing and embossing usefull topography onto dielectric film coatings on substrates and devices are provided, together with devices fabricated by the inventive methods.

In order to better appreciate the scope of the invention, it should be understood that unless the "$SiO_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable starting material containing one or more silicon-based dielectric precursors. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Additionally, the term "aging" refers to the gelling or polymerization, of the combined silica-based precursor composition on the substrate after deposition, induced, e.g., by exposure to water and/or an acid or base catalyst. Gelling is optionally applied to precursors selected to form foamed, i.e., nanoporous dielectric films, and/or nonporous dielectric films. Gelling can be accomplished by the above-described crosslinking and/or evaporation of a solvent.

The term "curing" refers to the hardening and drying of the film, after gelling, typically by the application of heat, although any other art-known form of curing may be employed, e.g., by the application of energy in the form of an electron beam, ultraviolet radiation, and the like.

The terms, "agent" or "agents" herein should be considered to be synonymous with the terms, "reagent" or "reagents," unless otherwise indicated.

Further, although the description provided herein generally describes processes and apparatus employed for preparing and planarizing or embossing patterns onto foamed dielectric materials, such as the exemplified nanoporous silica films, the artisan will readily appreciate that the instantly provided methods and compositions are optionally applied to other substrate surfaces, and that other plarizing materials can be employed, including, for example, nonporous silica dielectric films and organic polymer-based dielectric films.

In addition, terms, "flat" or "planar" are intended to be equivalent, unless otherwise stated, when used herein. When these terms are employed with reference to a dielectric film produced by the inventive methods, it is to indicate that the film has the desired degree of planarization.

Absent any statement to the contrary, reference herein to a "planarization object" and/or "planarization surface" or "compression tool" is intended to encompass objects or surfaces bearing any usefull topography, including a simple plane, a set of two or more planar regions and/or any other suitable pattern to be embossed or impressed on a nanoporous dielectric silica film.

In addition, any suitable art-known objects can be used as planarization objects or compression tools to emboss or impress a plastic or malleable dielectric film surface with a topographical pattern, i.e., including one or more planar impressions. Planarizaton objects can have at least one flat surface such as optical flats and the like, or have a contact surface that is curved in one of its dimensions, including drums, rollers, or more complex curved surfaces. Thus, for planariation objects having curved surfaces, it will be appreciated that contact between such a curved surface and the surface to be treated will be achieved with a rolling motion or rotating motion. In addition, it will be understood that the planarization object is typically incorporated into any art-known press or roller device to provide the mechanical force necessary to conduct the compression step according to the invention.

Broadly, a substrate coating can be contacted with a planarization object before, during or after the aging and/or curing of the applied dielectric film. It is simply required that the applied film or coating be sufficiently plastic or pliable to accept the planar impression, without damaging or preventing formation of desirable features, e.g., the nanometer-scale pore structure of silica dielectric films, when that feature is desired.

It will also be appreciated that the planarization processes and apparatus provided by the invention can optionally provide a nanoporous dielectric silica film having a sealed film surface, which can provide the added benefits of improved mechanical properties, e.g., increased cohesive strength, modulus, or adhesion, relative to nonplanarized films, and optionally can obviate a need for post-curing surface modification to enhance surface hydrophobic properties.

A. Methods for Preparing Dielectric Films

Dielectric films, e.g., interlevel dielectric coatings, are prepared from suitable precursors applied to a substrate by any art-known method, including spin-coating, dip coating, brushing, rolling, spraying and/or by chemical vapor deposition. The precursor can be an organic polymer precursor, a silicon-based precursor and/or combinations thereof The coating is then processed to achieve the desired type and consistency of dielectric coating, wherein the processing steps are selected to be appropriate for the selected precursor and the desired final product.

Typically, silicon-based dielectric films, including nanoporous silica dielectric films, are prepared from a suitable silicon-based dielectric precursor, e.g., a spin-on-glass ("S.O.G.") material blended with one or more solvents and/or other components. The dielectric precursor is applied to a surface to be planarized by any art-known method, e.g., including, but not limited to, spin-coating, dip coating, brushing, rolling, spraying and/or by chemical vapor deposition. Prior to application of the base materials to form the dielectric film, the substrate surface is optionally prepared for coating by standard, art-known cleaning methods.

After the precursor is applied to the substrate surface, the coated surface is contacted with a planarization object, i.e., in the form of a compression tool, for a time and at a pressure effective to transfer the desired pattern to the dielectric coating or film on the substrate surface.

Preferably, the contact surface of the object is fabricated or coated with a non-stick release material, e.g., Teflon™ or its functional equivalent. This can be in the form of a removable film or sheet of release material. Alternatively, the release material can be provided as a release coating directly on the compression tool working surface. The release material or coating can include any art-known materials, e.g., fluorocarbons, hydrocarbons, or other organic and/or inorganic materials which are either liquid or solid.

Optionally, the release material is selectively permeable, e.g., composed of or including Gortex™ and is able to pass vapor phase reagents, dissolved gases, reaction product gases, and/or solvents into or away from the surface being compressed. Advantageously, such a selectively permeable membrane can prevent the formation of bubble artifs on or within the planarized surface. Such a selectively permeable non-stick surface can also optionally be replaced or under-coated with a material that is selected to absorb and/or adsorb gases or vapors that might lead to undesirable formation of bubbles on the pressed surface. In another option, the contact surface of the compression tool incorporates one or more openings or passages to allow for venting of any excess vapors or gases and the release material is on the working face of the compression tool.

Once the surface of the treated dielectric film has assumed the desired shape, the compression tool and any non-stick release material are then separated from the dielectric film, although in certain embodiments an optional non-stick release material can be left on the substrate coating for an additional time period, to allow more time for aging or gelation, to allow for further film processing and/or to protect the newly planarized surface during further processing steps.

When the release material is a coating on the compression tool working surface, the release coating can optionally be dissolved or otherwise neutralized, allowing ease of separation of the compression tool from the planarized film. In one preferred embodiment, the release material can be a material that is vaporized when neutralized. The expanding vapor from the neutralized coating then assists in pushing the compression tool off of the planarized film. Vaporizable release materials suitable for this purpose include, simply by way of example, polyalkylene oxides or PAOs, with molecular weights ranging from about 500 to about 5000. These types of polymers can be spin coated in a uniform thin film onto the working face of a planarization object in its melted state (~100 C. melting point) or with a solvent (such as water or alcohol). The PAO is desirably solid at room temperature, to allow a hard contacting surface for planarization. After forming or gelling or both, the PAO can be melted for release, or further heated (>100 C.) to either vaporize or thermally decompose to form a vapor which can separate the parts. Preferred polyalkylene oxide polymers include, simply by way of example, polyethylene oxides and/or polyethylene glycols or PEGs, in the same general molecular weight range.

Yet another variation on release materials that can be volatized is to combine a material which is normally solid at room temperature, such as a PEG that can be compounded with a low to medium weight glycol or alcohol, and still remain as a solid compound at room temperature. The glycol components can then be easily vaporized to allow release of the planarization flat from the dielectric film. Common petroleum based waxes also have similar properties and can perform the same function.

Precursors for Dielectric Films

Examples of suitable dielectric precursors broadly include monomers, monomer mixtures, oligomers, and oligomer mixtures that are solidified through curing by incorporated or applied reagents, heat, radiation and the like, and/or various art-known combinations thereof. Other examples of suitable materials include solid materials such as polymer melts that can softened by heating, and then resolidified through cooling.

Organic-Based Precursors for Dielectric Films

Organic polymer precursors that can optionally be employed to form planarized or embossed interlevel dielectric films using the methods and apparatus of the invention are well known and include, simply by way of example, polyimide precursors as described, e.g., by U.S. Pat. Nos. 4,113,550, 4,218,283 and 4,436,583, all incorporated herein by reference in their entireties. Preferred organic dielectric precursors include, simply by way of example, ethers of oligomeric phenol-dialdehyde condensation products containing vinyl benzyl moieties in at least half of the ether moieties as described in co-owned U.S. Pat. No. 4,908,096, incorporated herein by reference in its entirety. Other preferred organic polymers include fluorinated and non-fluorinated polymers, in particular fluorinated and non-fluorinated poly(aryl ethers) available under the tradename FLARE™ from Honeywell International Inc., and copolymers mixtures thereof The polymer component is preferably present in an amount of from about 10% to about 30% by weight of the composition. A more preferred range is from about 5% to about 30% and most preferably from about 17% to about 25% by weight of the composition.

Epoxy resins are additional examples of dielectric precursors that are suited for use in the present process. One example of a suitable epoxy resin is epoxy novolac 431 (DEN-431) which is commercially obtained from the Dow Chemical Co. The uncured resin has a viscosity of about 100 cp at a temperature of 100° C. The resin is cured at a temperature of about 100° C. in the presence of an acid catalyst. An example of a suitable acid catalyst is the photoacid generator triphenylsulphonium hexafluoroantimonate.

Silicon-Based Precursors for Dielectric Films

Preferred silicon-based dielectric precursors include organosilanes, including, for example, alkoxysilanes according to Formula I, as taught, e.g., by co-owned U.S. Ser. No. 09/054,262, filed on Apr. 3, 1998, the disclosure of which is incorporated by reference herein in its entirety.

Formula I

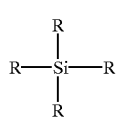

In one embodiment, Formula I is an alkoxysilane wherein at least 2 of the R groups are independently $C_1$ to $C_4$ alkoxy groups, and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane. As exemplified below, a partially hydrolyzed and partially condensed fluid alkoxysilane composition can be employed. Such a precursor is commercially available as Nanoglass™ K2.2 (Honeywell International Inc., Advanced Micoelectronic Materials).

In a further option, for instance, especially when the precursor is applied to the substrate by chemical vapor deposition, e.g., as taught by co-owned patent application Ser. No. 09/111,083, filed on Jul. 7, 1998, and incorporated by reference herein in its entirety, the precursor can also be an alkylalkoxysilane as described by Formula I, but instead, at least 2 of the R groups are independently $C_1$ to $C_4$ alkylalkoxy groups wherein the alkyl moiety is $C_1$ to $C_4$ alkyl and the alkoxy moiety is $C_1$ to $C_6$ alkoxy, or ether-alkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is $C_1$ to $C_4$ alkyl and the alkoxy moiety is $C_1$ to $C_6$ alkoxy. In yet another preferred embodiment for a vapor phase precursor, at least two R groups are ether-alkoxy groups of the formula $(C_1$ to $C_6$ aloxy$)_n$ wherein n is 2 to 6.

Application Ser. No. 09/111,083, mentioned above, also teaches that preferred silica precursors for chemical vapor deposition include, for example, any or a combination of alkoxysilanes such as tetraethoxysilane, tetrapropoxysilane, tetraisopropoxysilane, tetra(methoxyethoxy)silane, tetra (methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy) silane, tetrakis(2-ethylthoxy)silane, tetrakis (methoxyethoxy)silane, and tetrakis(methoxypropoxy) silane are particularly useful for the invention. Additionally, partially hydrolyzed, condensed or polymerized derivatives of these species can be used in this invention. Other precursors of utility to this invention could include precursors which can be cross-linked by exposure to heat or light. In general, the precursors can be gases, liquids or solids at room temperature.

In other preferred embodiments, the silicon-based dielectric precursor(s) can also be selected from one or more additional polymers, as taught by co-owned U.S. Ser. No. 60/098,515, filed on Aug. 31, 1998, and incorporated by reference herein in its entirety, including, but not limited to, a silsesquioxane polymer, hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x is about 6 to about 20, y is 1 to about 3, z is about 6 to about 20, n ranges from 1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Thus, useful silicon-based polymers nonexclusively include hydrogensiloxane, hydrogensilsesquioxane, hydrogenmethylsiloxane, hydrogenethylsiloxane, hydrogenpropylsiloxane, hydrogenbutylsiloxane, hydrogentertbutylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentertbutylsilsesquioxane and hydrogenphenylsilsesquioxane and mixtures thereof, as well as others too numerous to mention.

In further preferred embodiments, as taught by co-owned U.S. Ser. No. 60/098,068, filed on Aug. 27, 1998, incorporated by reference herein in its entirety, the silica precursor (s) can also be formed by reacting certain multifunctional silane reagents prior to application of the reaction product to a substrate. For example, such precursors are formed by reacting a multifunctional, e.g., a tri-functional silane precursor, with a tetra-functional silane precursor and then depositing the reaction product on a substrate.

Desirable multi-functional alkoxysilanes are selected from the group having the formula $$A_n\text{—}SiH_m \qquad \text{Formula II}$$

wherein each A is independently an alkoxy (O—R) wherein R is an organic moiety independently selected from the group consisting of an alkyl and an aryl, and wherein n is an integer ranging from 1 to 3; m is an integer ranging from 1 to 3 and the sum of m and n is 4.

A tetra-functional alkoxylsilane employed in the processes of the invention preferably has a formula of $$A_4\text{—}Si \qquad \text{Formula III}$$

wherein each A is independently an alkoxy (O—R) and R is an organic moiety independently selected from the group consisting of an alkyl and an aryl, In a further aspect of the invention, the alkoxysilane compounds described above may be replaced, in whole or in part, by compounds with acetoxy and/or halogen-based leaving groups. For example, the precursor compound may be an acetoxy ($CH_3$—CO—O—) such as an acetoxy-silane compound and/or a halogenated compound, e.g., a halogenated silane compound and/or combinations thereof. For the halogenated precursors the halogen is, e.g., Cl, Br, I and in certain aspects, will optionally include F.

A low organic content alkoxysilane useful in forming dielectric films include those of formulas IV–VII, below, where the carbon containing substituents are present in an amount of less than about 40 mole percent.

$$[\text{H—SiO}_{1.5}]_n[\text{R—SiO}_{1.5}]_m, \qquad \text{Formula IV}$$

$$[\text{H}_{0.4\text{-}1.0}\text{SiO}_{1.5\text{-}1.8}]_n[\text{R}_{0.4\text{-}1.0}\text{—SiO}_{1.5\text{-}1.8}]_m, \qquad \text{Formula V}$$

$$[\text{H}_{0\text{-}1.0}\text{—SiO}_{1.5\text{-}2.0}]_n[\text{R—SiO}_{1.5}]_m, \qquad \text{Formula VI}$$

$$[\text{H—SiO}_{1.5}]_x[\text{R—SiO}_{1.5}]_y[\text{SiO}_2]_z \qquad \text{Formula VII}$$

wherein the sum of n and m, or the sum or x, y and z is from about 8 to about 5000, and m and y are selected such that carbon containing substituents are present in an amount of less than about 40 mole percent. R, is selected from substituted and unsubstituted straight chain and branched alkyl groups, cycloalkyl groups, substituted and unsubstituted aryl groups, and mixtures thereof The specific mole percent of carbon containing substituents is a function of the ratio of the amounts of starting materials. In a preferred embodiments the mole percent of carbon containing substituents is in the range of from about 15 mole percent to about 25 mole percent. These polymers are described more fully in U.S. patent application Ser. No. 09/044,831, filed Mar. 20, 1998, which is incorporated herein by reference. A suitable low organic content polymer precursor is available commercially as LOSP™ (Honeywell International Inc. at Santa Clara, Calif.).

A high organic content alkoxysilane useful in forming dielectric films include those of formulas wherein the carbon containing substituents are present in an amount of about 40 mole percent or more. These polymers are described more fully in coowned U.S. patent application Ser. No. 09/044,798, filed Mar. 20, 1998, which is incorporated herein by reference. Such have the formulae VII–X:

$$[\text{HSiO}_{1.5}]_n[\text{RSiO}_{1.5}]_m, \qquad \text{Formula VIII}$$

$$[\text{H}_{0.4\text{-}1.0}\text{SiO}_{1.5\text{-}1.8}]_n[\text{R}_{0.4\text{-}1.0}\text{SiO}_{1.5\text{-}1.8}]_m, \qquad \text{Formula IX}$$

$$[\text{H}_{0\text{-}1.0}\text{SiO}_{1.5\text{-}2.0}]_n[\text{RSiO}_{1.5}]_m, \qquad \text{Formula X}$$

wherein the sum of n and m is from about 8 to about 5000 and m is selected such that the carbon containing substituent is present in an amount of from about 40 Mole percent or greater; and $$[\text{HSiO}_{1.5}]_x[\text{RSiO}_{1.5}]_y[\text{SiO}_2]_z, \qquad \text{Formula XI}$$

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted awyl groups, and mixtures thereof. The specific mole percent of carbon containing substituents is a function of the ratio of the amounts of starting materials. A suitable high organic content polymer precursor is available commercially as HOSP™ (Honeywell International Inc. at Santa Clara, Calif.).

Polymers of the structures IV–XI may be prepared by mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system. Additional information on preparation of these polymers is provided by co-owned U.S. Patent Application Ser. No. 09/328,648, filed on Jun. 9, 1999, the disclosure of which is incorporated by reference herein in its entirety.

Generally for the above-described base materials or dielectric film precursors, the polymer component is preferably present in an amount of from about 10% to about 50% by weight of the composition. A more preferred range is from about 15% to about 30% and most preferably from about 17% to about 25% by weight of the composition. Preferred siloxane materials are commercially available, for example, from Honeywell International Inc. under the tradename Accuglass®.

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit or related device, and the base material from which the nanoporous silica film is formed is applied onto the substrate by conventional methods, e.g., including, but not limited to, the art-known methods of spin-coating, dip coating, brushing, rolling, spraying and/or chemical vapor deposition, or other suitable method or methods. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof, e.g., in the form of a polished wafer. The substrate surface typically includes an optional pattern of raised lines, such as metal, oxide, nitride or oxynitride lines which are formed by well known lithographic techniques. Suitable materials for the lines, that form the conductors or insulators of an integrated circuit, include silica, silicon nitride, titanium nitride, tantalum nitride, aluminum, aluminum alloys, copper, copper alloys, tantalum, tungsten and silicon oxynitride. Such are typically closely separated from one another at distances of about 20 micrometers or less, preferably 1 micrometer or less, and more preferably from about 0.05 to about 1 micrometer. Other optional features of the substrate surface include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane ("PETEOS") silane oxide and combinations thereof, as well as one or more previously formed nanoporous silica dielectric films The dielectric films can be applied so as to cover and/or lie between such optional electronic surface features, e.g., circuit elements and/or conduction pathways. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit.

A. Applying a Silicon-Based Dielectric Precursor to a Substrate

Silicon-based dielectric films, including nanoporous silica dielectric films, are prepared by coating a silicon-based dielectric precursor onto a substrate or substrates using methods based upon those described in detail in, for example, in co-owned U.S. Ser. No. 09/054,262, filed on Apr. 3, 1998, the disclosure of which is incorporated by reference herein in its entirety. Modifications to methods described in U.S. Ser. No. 09/054,262, for example, include those that are those optionally required by the need for contacting the film material with a planarization object.

Typically, a nanoporous silica dielectric film is prepared by forming a reaction product of, for example, at least one alkoxysilane, e.g., as described by Formula I, supra, a solvent composition, optional water and an optional catalytic amount of an acid or base. Water is included to provide a medium for hydrolyzing the alkoxysilane.

Preferably the solvent composition comprises at least one relatively high volatility solvent and at least one a relatively low volatility solvent.

This reaction product is applied onto a substrate, as described supra. The high volatility solvent evaporates during and immediately after deposition of the reaction product. The reaction product is hydrolyzed and condensed until it forms a gel layer. For planarization, for example, a flat surface can be contacted with the gel layer after the high volatility solvent has evaporated, leaving behind a viscous coating, but before the curing or aging process has progressed sufficiently to render the coating non-pliable.

For purposes of the invention, "a relatively high volatility solvent" is one which evaporates at a temperature below, preferably significantly below that of the relatively low volatility solvent. The relatively high volatility solvent preferably has a boiling point of about 120° C. or less, preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

For purposes of the invention, "a relatively low volatility solvent" composition is one which evaporates at a temperature above, preferably significantly above, that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2, 4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof, Other relatively low volatility solvent compositions which are compatible with the other ingredients can be readily determined by those skilled in the art.

In another option, acid catalysts can be employed. Suitable acids are nitric acid and compatible organic acids which are volatile, i.e. which evaporate from the resulting reaction product under the process operating conditions, and which do not introduce impurities into the reaction product.

The silane component, e.g., alkoxysilane, is preferably present in an amount of from about 3% to about 50% by weight of the overall blend. A more preferred range is from about 5% to about 45% and most preferably from about 10% to about 40%.

The solvent component is preferably present in an amount of from about 20% to about 90% by weigh of the overall blend. A more preferred range is from about 30% to about 70% and most preferably from about 40% to about 60%. The greater the percentage of high volatility solvent employed, the thinner is the resulting film. The greater the percentage of low volatility solvent employed, the greater is the resulting porosity The mole ratio of water to the silane component is preferably from about 0 to about 50. A more preferred range is from about 0.1 to about 10 and most preferably from about 0.5 to about 1.5. The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

The prepared silicon-based dielectric precursor is then coated on a substrate. The layer is relatively uniformly applied. While the substrate can be any art-known material, e.g., as described supra, typical substrates are polished semiconductor wafers, optionally having one or more semiconductor components previously fabricated on the surface.

The solvent, usually the higher volatility solvent is then at least partially evaporated from the coating. The more volatile solvent evaporates over a period of seconds or minutes. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more range from about 20° C. to about 35° C.

The coated substrate is then placed in a sealed chamber and is rapidly evacuated to a vacuum. In the preferred embodiment, the pressure of the evacuated chamber ranges from about 0.001 torr to about 0.1 torr, or greater. In an alternative embodiment, the chamber pressure may range from about 0.001 torr to about 760 torr, or greater. Typically, the pressure is about 250 torr. Then the coating is sequentially exposed to both a water vapor and a base vapor, either simultaneously or sequentially. For purposes of this invention, a base vapor includes gaseous bases. Preferably the coating is first exposed to a water vapor and then exposed to a base vapor, however, in an alternate embodiment, the coating may first be exposed to a base vapor and then a water vapor. The first of the two exposures is conducted such that thereafter the pressure in the chamber remains at sub-atmospheric pressure. The second exposure may be conducted at atmospheric pressure, sub-atmospheric pressure or super-atmospheric pressure.

In one preferred embodiment, after the coated substrate is placed in the sealed chamber and the chamber evacuated to a vacuum, a valve is opened to a reservoir of water, and water vapor quickly fills the chamber. The partial pressure of water vapor, $P_{H2O}$ is controlled by the length of time that the valve is open and the temperature at which the liquid water reservoir is maintained. Because of the low vapor pressure of water, the chamber pressure after water addition is much less than ambient. The pressure rise that occurs in the chamber during the water vapor addition is a direct measure of the water vapor partial pressure. In the preferred embodiment, the pressure of the evacuated chamber after the water vapor exposure ranges from about 0.1 torr to about 150 torr, preferably about 1 torr to about 40 torr and more preferably from about 5 torr to about 20 torr. In the preferred embodiment, the temperature of the water during the exposure ranges from about 10° C. to about 60° C., preferably from about 15° C. to about 50° C., and more preferably from about 20° C. to about 40° C. In the preferred embodiment, the temperature in the chamber after water exposure ranges from about 10° C. to about 50° C., preferably from about 15° C. to about 40° C., and more preferably from about 20° C. to about 40° C.

After water vapor addition, a base vapor is dosed into the chamber. The chamber pressure after base dosing may be at, above or below atmospheric pressure. If the pressure is above atmospheric, the chamber must be designed to resist the total system pressure. As with water vapor, the partial pressure of the base is known directly from the pressure rise during base dosing. Because the chamber only contains base and water vapor, except for trace amounts of atmospheric gas left from the initial chamber pumpdown, the base and water diffusion rates are much faster than the case when evacuation is not conducted, resulting in greatly increased polymerization rates, decreased process time per coated substrate, and greater uniformity across the coated surface. Since the base and water vapor are added separately, their partial pressures are easily measured and there is very little waste. Only the vapor above the wafer need be removed upon deposition. The order of addition of water and base may be reversed but the addition of water before the base is preferred because of its lower vapor pressure. In the preferred embodiment, the pressure of the evacuated chamber after the base vapor exposure ranges from about 100 torr to about 2,000 torr, preferably about 400 torr to about 1,000 torr and more preferably from about 600 torr to about 800 torr. In the preferred embodiment, the temperature of the base during the exposure ranges from about 10° C. to about 60° C., preferably from about 15° C. to about 40° C., and more preferably from about 20° C. to about 30° C. In the preferred embodiment, the temperature in the chamber after base exposure ranges from about 10° C. to about 50° C., preferably from about 15° C. to about 40° C., and more preferably from about 20° C. to about 40° C.

Suitable bases (e.g., alkaline regents) for use in the base vapor nonexclusively include ammonia and non-volatileamines, such as primary, secondary and tertiary all amines, aryl amines, alcohol amines and mixtures thereof which have a boiling point of about 200° C. or less, preferably 100° C. or less and more preferably 25° C. or less. Preferred amines do not require an atmosphere for aging, i.e., while the film is being impressed with a flat surface, and include, for example, monoethanol amine, tetraethylenepentamine, 2-(aminoethylamino)ethanol, 3-aminopropyltriethoxy silane, 3-amino-1,2-propanediol, 3-(diethylamino)-1,2-propanediol, n-(2-aminoethyl)-3-aminopropyl-trimethoxy silane, 3-aminopropyl-trimethoxy silane. Additional amines that are useful for the processes of the invention include, e.g., methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basic constant $K_b$ and $pK_b = -\log K_b$. In the preferred embodiment, the $pK_b$ of the base may range from about less than 0 to about 9. A more preferred range is from about 2 to about 6 and most preferably from about 4 to about 5.

Preferably, the mole ratio of water vapor to base vapor ranges from about 1:3 to about 1:100, preferably from about 1:5 to about 1:50, and more preferably from about 1:10 to about 1:30.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The film is then dried in a conventional way by solvent evaporation of the less volatile solvent. Elevated temperatures may be employed to dry the coating in this step. Such temperatures may range from about 20° C. to about 450° C., preferably from about 50° C. to about 350° C. and more preferably from about 175° C. to about 320° C.

Optionally, additional process steps may be applied to the formed nanoporous silica dielectric film, including, for example, a solvent rinse, a surface modification to enhance hydrophobicity, and any other art-known process steps as required.

After the desired time of reaction after base addition, on the order of seconds to a few minutes, the chamber pressure is brought to atmospheric pressure. This can be accomplished by either adding an inert gas such as nitrogen and opening the chamber or evacuating the base/water mixture via vacuum and backfilling with an inert gas, or even optionally venting the chamber with a non-inert gas, such as air.

Thus, a precursor is deposited on a wafer and the more volatile solvent continues to evaporate over a period of seconds. The wafer is placed in a sealed chamber at ambient pressure. The chamber is opened to a vacuum source and the ambient gas is evacuated and the chamber pressure decreases well below the partial pressure of water vapor. In the next step, water vapor is added and the chamber pressure increases. The pressure increase during that step is the water partial pressure ($P_{H2O}$). The base vapor, in this case ammonia, is introduced into the chamber and polymerization is triggered. The pressure increase during this step is the base partial pressure (for example, $P_{NH3}$), so that the total pressure in the chamber at the end of the ammonia addition cycle is the sum of the partial pressures of water vapor and ammonia. After the desired time, the chamber pressure may be raised to ambient by filling with an inert gas, such as nitrogen as shown, or it may be first evacuated to vacuum and subsequently backfilled to ambient pressure.

As a result, a relatively high porosity, low dielectric constant, silicon containing polymer composition forms on the substrate surface. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 g/cm$^2$, more preferably from about 0.25 to about 1.6 g/cm$^2$, and most preferably from about 0.4 to about 1.2 g/cm$^2$.

B. Methods of Producing Dielectric Film
By Applying Base Material Mixed in Mid-Stream In another preferred embodiment, the nanoporous silica dielectric film is prepared by coating a substrate with a silicon-based precursor composition that is pre-mixed by combining multiple streams of free-flowing component precursor reagents before the composition is applied to a substrate. In this embodiment, a nanoporous silica dielectric film is formed on a substrate by (i) combining a stream of a silicon-based precursor or base material, such as, for example, an alkoxysilane composition, with a stream of a base containing catalyst composition to form a combined composition stream; immediately depositing the combined composition stream onto a surface of a substrate and exposing the combined composition to water (in either order or simultaneously); and planarizing the film during the curing of the combined composition; or (ii) combining a stream of a silicon-based precursor or base material, such as, for example, an alkoxysilane composition, with a stream of water to form a combined composition stream; immediately depositing the combined composition stream onto a surface of a substrate; and planarizing the film during the curing of the combined composition.

Methods (i) and (ii) are described in detail, absent the planarization features of the present invention, in co-owned U.S. Ser. No. 09/140,855, filed on Aug. 27, 1998, the disclosure of which is incorporated by reference herein in its entirety. Processes for the preparation of nanoporous dielectric silica films by mixing streams of @ 15 components is summarized in greater detail, as follows. Modifications to methods described in U.S. Ser. No. 09/140,855 are those optionally required by the need for contacting the film material with a planarization object.

The first step of this process is to prepare a base material in the form of a mixture of at least one precursor, such as an alkoxysilane, as described for Formula I, supra, and a solvent composition. The mixture is then discharged onto a suitable substrate in the form of a stream. In one preferred embodiment, the stream of alkoxysilane composition is combined with a stream of water to form a combined composition stream immediately prior to contacting the substrate.

In an alternate preferred embodiment, a combined composition stream is formed from stream of the alkoxysilane composition and a stream of a base (i.e. alkaline) containing catalyst composition, e.g., an amine compound, as described, supra. The combined composition stream is thereafter deposited onto a surface of a substrate. Optionally, the combined composition stream is deposited onto the substrate and is then exposed to the water, in the form of a water vapor atmosphere. Alternatively, the combined composition stream is exposed to the water before deposition onto the substrate. In yet another option, the combined composition stream is simultaneously exposed to the water and deposited onto the substrate. This may be in the form of a water stream or a water vapor atmosphere. After deposition and water exposure, the combined composition may be cured, aged, or dried before, during or after planarization, to thereby form a nanoporous dielectric coating on the substrate.

Whichever of the above options is selected for conducting the process, the above-described components of the combined stream composition contact each other in the space above the surface of the substrate, immediately prior to deposition. At a point of confluence of the individual streams, the combined stream is unbounded by tubing, piping, manifolds or the like. This minimizes reaction time between the components prior to deposition and prevents reaction within the intersection point of supply tubes.

Preferably, the components are all in a liquid form and any suitable apparatus for distributing the liquid components may be used for depositing the above-described combined streams of, e.g., alkoxysilane, water and base compositions according to the present invention. Suitable apparatus includes, for example, syringe pumps, but the artisan will appreciate that other devices may be used to form the combined composition stream. Such nonexclusively include faucets, sprayers, hoses, tanks, pipes, tubes, and the like. Various methods of combining the components may be used, such as dripping, squirting, streaming, spraying, and the like.

Exemplary apparatus for conducting this process includes separate containers, e.g., tanks, for storing separate components until the process begins. Each respective tank has a corresponding separate discharge tube for discharging the respective component to be combined into a single stream, so that the combined stream can be deposited onto a substrate surface. Each component is propelled through its respective discharge tube by, e.g., gravity feed and/or by the action of one or more pumps. The artisan will also appreciate that the apparatus can also provide for propelling one or more component(s) by applying positive gas or air pressure to the corresponding storage tank. The flow through each respective discharge tube is optionally regulated by one or more flow control valves located between the distal end of each discharge tube and its respective tank and/or by control of the pumping action, when pumps are employed to propel flow of components. If the components are propelled by air or gas pressure, component flow can also be regulated, in whole or in part, by controlling the pressure of the air or gas propellant.

The discharge tubes are positioned so that each of the respective discharge streams combine together to form a combined composition stream, which is deposited onto a surface of a substrate positioned to received the combined composition stream. Optionally, each discharge tube may also include a shaped nozzle, e.g., a spinner nozzle, or a nozzle formed of one or more openings, e.g., analogous to a showerhead, suitable for forming a discharge stream that mixes well with other such streams. The artisan will appreciate that the dimensions of any provided nozzle, and/or the discharge end of each discharge tube, can be readily modified to assist in regulating pressure and flow rate for each stream, to assure optimal stream contact, mixing, and spreading of the resulting mixed composition stream over the substrate, depending, for example, upon the rate at which the process is conducted, the reaction speed, and the viscosity of the respective component.

A variety of processes may be employed by this method to form a nanoporous dielectric film on a substrate. For a two-component process the components can be, for example, alkoxysilane composition and water, each stored in a separate tank until needed, or alternatively, a base containing catalyst composition in place of the water component.

For a three-component process, the apparatus can have three separate tanks each with a corresponding discharge tube for discharging one of three components, e.g., an alkoxysilane composition, a base containing catalyst composition, and water, respectively. Additional storage tanks and discharge tubes can be added, if required to deliver additional component(s) for the selected process.

For example, when the combined stream is formed of alkoxysilane and base catalyst, the combined stream can be deposited on a substrate positioned in a closed environment that includes a water vapor atmosphere. The closed environment can be formed by any suitable chamber or enclosure able to contain the substrate and vapor component(s). The enclosure will have an inlet or inlets for the component discharge tubes. Preferably, the enclosure portion of the apparatus will also include an additional inlet, with an optional valve, to admit a vapor, a gas-vapor mixture or optionally a liquid to be converted to vapor within the enclosure.

For example, with a two-component combined stream as described above, the apparatus will be constructed as broadly described above, with the additional components of a source of water vapor is provided, e.g., an evaporation bottle or chamber, the evaporation bottle preferably including a heat source for promoting water vaporization and optionally a source of flowing air or inert gas to carry the water vapor into the enclosure. With the enclosure of the substrate, this apparatus operates to expose the combined composition stream to water either during or after deposition onto a surface of the enclosed substrate. The enclosure will also optionally include outlets to allow for venting and/or recycling of the unreacted water vapor and/or other unreacted components.

Useful alkoxysilanes include those defined as for Formula I, supra. Also as defined supra, preferred alkoxysilanes nonexclusively include tetraethoxysilane (TEOS) and tetrnenthoxysilane.

The solvent composition for the base component, e.g., an alkoxysilane, preferably comprises a relatively high volatility solvent or a relatively low volatility solvent or both a relatively high volatility solvent and a relatively low volatility solvent. The solvent, usually the higher volatility solvent, is at least partially evaporated immediately after deposition onto the substrate. This partial drying leads to better planarity, even absent the additional planarization steps of the instant invention, due to the lower viscosity of the material after the first solvent or parts of the solvent comes off. The more volatile solvent evaporates over a period of seconds or minutes. Slightly elevated temperatures may optionally be employed to accelerate this step. Such temperatures preferably range from about 20° C. to about 80° C., more preferably from about 20° C. to about 50° C. and most preferably from about 20° C. to about 35° C.

The meaning of the expressions, "a relatively high volatility solvent" and "a relatively low volatility solvent composition" is as defined in Section A, supra.

The alkoxysilane component is preferably present in an amount of from about 3% to about 50% by weight of the overall blend, more preferably from about 5% to about 45% and most preferably from about 10% to about 40%.

The solvent component of the alkoxysilane precursor composition is preferably present in an amount of from about 20% to about 90% by weight of the overall blend, more preferably from about 30% to about 70% and most preferably from about 40% to about 60%. When both a high and a low volatility solvent are present, the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

The base containing catalyst composition contains a base, or a base plus water, or a base plus an organic solvent, or a base plus both water and an organic solvent. The base is present in a catalytic amount which can be readily determined by those skilled in the art. Preferably the molar ratio of base to silane ranges from about 0 to about 0.2, more preferably from about 0.001 to about 0.05, and most preferably from about 0.005 to about 0.02. Water is included to provide a medium for hydrolyzing the alkoxysilane. The mole ratio of water to silane is preferably from about 0 to about 50, more preferably from about 0.1 to about 10 and a most preferably from about 0.5 to about 1.5. Suitable solvents for the base containing catalyst composition include those listed above as a high volatility solvent. Most preferred solvents are alcohols such as ethanol and isopropanol.

The temperature of the water during the exposure preferably ranges from about 10° C. to about 60° C., more preferably from about 15° C. to about 50° C., and most preferably from about 20° C. to about 40° C. The temperature of the base during the exposure preferably ranges from about 10° C. to about 60° C., more preferably from about 15° C. to about 40° C., and most preferably from about 20° C. to about 30° C.

Suitable bases nonexclusively include ammonia and amines, such as primary, secondary and tertiary alkyl amines, aryl amines, alcohol amines and mixtures thereof which have a preferred boiling point of at least about −50° C., more preferably at least about 50° C., and most preferably at least about 150° C. Suitable amines, in addition to those recited supra, also include, alcoholamines, alkylamines, methylamine, dimethylamine, trimethylamine, n-butylamine, n-propylamine, tetramethyl ammonium hydroxide, piperidine, 2-methoxyethylamine, mono-, di- or triethanolamines, and mono-, di-, or triisopropanolamines.

The combined composition may be cured, aged, or dried in a conventional way such as solvent evaporation of the less volatile solvent. Elevated temperatures may be employed to cure, age or dry the coating. Such temperatures preferably range from about 20° C. to about 450° C., more preferably from about 50° C. to about 350° C. and most preferably from about 175° C. to about 320° C.

As a result, a relatively high porosity, low dielectric constant silicon containing polymer composition is formed on the substrate. The silicon containing polymer composition preferably has a dielectric constant of from about 1.1 to about 3.5, more preferably from about 1.3 to about 3.0, and most preferably from about 1.5 to about 2.5. The pore size of silica composition preferably ranges from about 1 nm to about 100 nm, more preferably from about 2 nm to about 30 nm, and most preferably from about 3 nm to about 20 nm. The density of the silicon containing composition, including the pores, preferably ranges from about 0.1 to about 1.9 g/cm$^2$, more preferably from about 0.25 to about 1.6 g/cm$^2$, and most preferably from about 0.4 to about 1.2 g/cm$^2$.

C. Variations on Film Forming Processes

Variations on and modifications to the above-described processes for fabricating a nanoporous silica dielectric film have been described in a number of coowned U.S. patent applications and may optionally be utilized in the practice of the instant invention.

For example, the above-described methods may be modified by producing a film with at least two-different regions of density, i.e., adjacent regions of relatively high and relatively lower density, as disclosed by co-owned U.S. Ser. Nos. 09/046,473 and 09/046,475, both filed on Mar. 25, 1998, the disclosures of which are incorporated by reference herein in their entireties.

In a second variation, water and base vapor mixing efficiencies are improved by blending at least one alkoxysilane with a solvent composition and optional water and applying the blend to a semiconductor substrate and sequentially exposing the substrate to water vapor and a base vapor, in either order, at a pressure below atmospheric pressure, as disclosed by co-owned U.S. Ser. No. 09/054,262, filed on Apr. 3, 1998, the disclosure of which is incorporated by reference herein in its entirety.

In a third variation, a precursor mixture is formed of a relatively low volatility solvent composition that includes a $C_1$ to $C_4$ alkylether of a $C_1$ to $C_4$ alkylene glycol which is miscible in water, and alkoxysilanes as disclosed by co-owned U.S. Ser. Nos. 09/111,081, 09/111,082, both filed on Jul. 7, 1998, the disclosures of which are incorporated by reference herein in their entireties.

In a fourth variation, silica precursors, as defined above by, e.g., Formula I and the associated enumeration of preferred silica species, are deposited from the vapor phase, with an optional co-solvent, on a substrate to form a liquid-like film. Further details are provided by co-owned U.S. Ser. No. 09/111,083, filed on Jul. 7, 1998, the disclosure of which is incorporated by reference herein in its entirety.

In a fifth variation, a uniform nanoporous dielectric film can be formed from a liquid alkoxysilane precursor spin-deposited onto a horizontally positioned flat substrate centered and held within a cup having an open top section and a removable cover for closing the top. Further details are provided by co-owned U.S. Ser. No. 60/095,573, filed on Aug. 6, 1998, the disclosure of which is incorporated by reference herein in its entirety.

In a sixth variation, a precursor composition is formed from an alkoxysilane, an acid, and a solvent composition containing a high volatility and low volatility solvent. The relatively high volatility solvent is evaporated, and the low volatility solvent is partially evaporated from the precursor composition. Further details are provided by co-owned U.S. Ser. No. 09/234,609, filed on Jan. 21, 1999, the disclosure of which is incorporated by reference herein in its entirety.

In a seventh variation, a suitable substrate that includes a dielectric film is treated in a substantially oxygen free environment by heating the substrate to a temperature of about 350° C. or greater, for a time period of at least about 30 seconds. Further details are provided by co-owned U.S. Ser. No. 60/098,515, filed on Aug. 31, 1998, the disclosure of which is incorporated by reference herein in its entirety.

In an eighth variation, a substantially uniform alkoxysilane gel composition that includes a combination of at least one alkoxysilane, an organic solvent composition, water, and an optional base catalyst is formed on a substrate. The substrate is heated in an organic solvent vapor atmosphere to condense the gel composition, followed by curing, as described by co-owned U.S. Ser. No. 09/141,287, filed on Aug. 27, 1998, the disclosure of which is incorporated by reference herein in its entirety.

In a ninth variation, nanoporous silica dielectric coatings are formed on a substrate via chemical vapor deposition of a precursor. The deposited precursor is then exposed to a gelling agent, e.g., water vapor, and either an acid or a base vapor; and dried to form a relatively high porosity, low dielectric constant, silicon containing polymer composition on the substrate as described by co-owned U.S. Ser. No. 09/111,083, filed on Jul. 7, 1998, the disclosure of which is incorporated by reference herein in its entirety.

D. Surface Modification Reagents and Methods

Typically, the silica-based materials, such as the alkoxysiloxanes mentioned herein, form nanoporous films with surfaces, including surfaces of the pore structures, that contain silanol groups. Silanols and the water that they can adsorb from the air are highly polazable in an electric field, and thus will raise the dielectric constant of the film. To make nanoporous films substantially free of silanols and water, an organic reagent, i.e., a surface modification agent, such as hexamethyldisilazane or methyltriacetoxysilane, is optionally introduced into the pores of the film. Such sylilation reagent react with silanols on the pore surfaces to add organic, hydrophobic capping groups, e.g., trimethylsilyl groups. Thus, it has been found desirable to conduct additional processing steps to silylate free surface silanol groups, or to employ multifunctional base materials, as described supra, which do not produce such surface silanol groups.

A number of surface modification agents and methods for producing hydrophobic, low dielectric nanoporous silica films have been described, for example, in co-owned U.S. Ser. No: 60/098,068 and Ser. No. 09/140,855, both filed on Aug. 27, 1998, Ser. No. 09/234,609 and 09/235,186, both filed on Jan. 21, 1999, the disclosures of which are incorporated by reference herein in their entirety.

One preferred surface modification agent is a compound having a formula selected from the group consisting of Formulas XII (1–7)

$$R_3SiNHSiR_3, \tag{1}$$

$$R_xSiCl_y, \tag{2}$$

$$R_xSi(OH)_y, \tag{3}$$

$$R_3SiOSiR_3, \tag{4}$$

$$R_xSi(OR)_y, \tag{5}$$

$$M_pSi(OH)_{[4-p]}, \tag{6}$$

and/or $$R_xSi(OCOCH_3)_y \tag{7}$$

and combinations thereof, wherein x is an integer ranging from 1 to 3, y is an integer ranging from 1 to 3 such that y=4−x, p is an integer ranging from 2 to 3; each R is an independently selected from hydrogen and a hydrophobic organic moiety; each M is an independently selected hydrophobic organic moiety; and R and M can be the same or different. The R and M groups are preferably independently selected from the group of organic moieties consisting of alkyl, aryl and combinations thereof. The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the surface modification agent is an acetoxysilane, or, for example, a monomer compound such as acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof Most preferably the surface modification agent is hexamethyldisilazane. The surface modification agent may be mixed with a suitable solvent such as acetone, applied to the nanoporous silica surface in the form of a vapor or liquid, and then dried.

Additional surface modification agents include multifunctional surface modification agents as described in detail in co-owned U.S. Ser. No. 09/235,186, incorporated by reference herein in its entirety, as described above. Such multifunctional surface modification agents can be applied in either vapor or liquid form, optionally with or without co-solvents. Suitable co-solvents include, e.g., ketones, such as acetone, diisopropylketon, heptanone, 3-pentanone, and others, as described in detail in co-owned U.S. Ser. No. 09/111,084, filed on Jul. 7, 1998, the disclosure of which in incorporated by reference herein in its entirety. For example, as described in detail in U.S. Ser. No. 09/235,186, as incorporated by reference above, certain preferred surface modification agents will have two or more functional groups and react with surface silanol functional groups while minimizing mass present outside the structural framework of the film, and include, e.g., suitable silanols such as $R_1Si(OR_2)_3$ <span style="float:right">Formula XII</span> wherein $R_1$ and $R_2$ are independently selected moieties, such as H and/or an organic moiety such as an alkyl, aryl or derivatives of these. When $R_1$ or $R_2$ is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When $R_1$ or $R_2$ is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, $R_1$ or $R_2$ are independently selected from H, methyl, ethyl, propyl, phenyl, and/or derivatives thereof, provided that at least one of $R_1$ or $R_2$ is organic. In one embodiment, both $R_1$ and $R_2$ are methyl, and a tri-functional surface modification agent according to Formula V is methyltrimethoxysilane.

In another embodiment, a suitable silane according to the invention has the general formula of $R_1Si(NR_2R_3)_3$ <span style="float:right">Formula XIV</span> wherein $R_1$, $R_2$, $R_3$ are independently H, alkyl and/or aryl. When any of $R_1$, $R_2$, $R_3$ are alkyl and/or aryl they are defined as for $R_1$ and $R_2$ of Formula XIII, above. In preferred embodiments according to Formula VI, $R_1$ is selected from H, $CH_3$, $C_6H_5$, and $R_2$ and $R_3$ are both $CH_3$. Thus tri-functional surface modification agents according to Formula VI include, e.g., tris(dimethylamino)methylsilane, tris (dimethylamino)phenylsilane, and/or tris(dimethylamino) silane.

In yet another embodiment, a suitable silane according to the invention has the general formula of $R_1Si(ON=CR_2R_3)_3$ <span style="float:right">Formula XV</span> wherein $R_1$, $R_2$, $R_3$ are independently H, alkyl and/or aryl. When any of $R_1$, $R_2$, $R_3$ are alkyl and/or aryl, they are defined as for Formula VII, above. In one preferred embodiment, $R_1$ and $R_2$ are both $CH_3$, and $R_3$ is $CH_2CH_3$. Thus tri-functional surface modification agents according to Formula VII include, e.g., methyltris(methylethylkeoxime) silane.

In yet a further embodiment, a suitable silane according to the invention has the general formula of $R_1SiCl_3$ <span style="float:right">Formula XVI</span> wherein $R_1$ is H, alkyl or aryl. When $R_1$ is alkyl and/or aryl, they are defined as for Formula IV, above. In one preferred embodiment, $R_1$ is $CH_3$. Thus tri-functional surface modification agents according to Formula VIII include, e.g., methyltrichlorosilane.

In a more preferred embodiment, the capping reagent includes one or more organoacetoxysilanes which have the following general formula, $(R_1)_xSi(OCOR_2)_y$ <span style="float:right">Formula XVII</span>

Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MEASH"), dimethyldiacetoxysilane (MDAS), phenyltracetoxysilane and diphenyldiacetoxysilane and combinations thereof.

In an alternative embodiment, surface modification is provided by annealing the film with an electron beam. After a base material is deposited on a substrate, and optionally heated to evaporate solvents, the deposited composition is then annealed by exposure to electron beam radiation, in vacuo, at a temperature ranging from about 25° C. to about 1050° C., with a beam energy ranging from about 0.5 to about 30 KeV and an energy dose ranging from about 500 to about 100,000 $\mu C/cm^2$, respectively. The resulting films have essentially no or a reduced amount of carbon and hydrogen after the electron beam process. With methyl groups driven out of the nanoporous silica film, the hydrophobic and polarizable trimethylsilanols are reduced or not present. Further details are provided by co-owned U.S. Ser. No. 09/227,734, filed on filed on Jan. 9, 1999.

E. Contact Planarization and/or Embossing Methods

Broadly, production of planarired nanoporous dielectric silica film coatings on substrates can be conducted by applying a prepared liquid or vapor composition, that includes a suitable silicon-based dielectric precursor, to a substrate, and then completing formation of the desired nanoporous silica dielectric film, by methods modified to include contact with a planarization object, as follows.

(a) Increasing the coating viscosity by aging, i.e., gelling by a pre-added non-volatile acid or base catalyst and/or water, or by contacting the coating with an acid or base catalyst and/or water after application to the substrate.

(b) Contacting the coating with, e.g., a planarization object, having at least one contact surface able to impart the desired degree of planarity, or other desired pattern, with sufficient pressure to transfer an impression to the coating without substantially impairing formation of nanoporous structure.

(c) Separating the planarized or embossed coating from the planarizing object.

(d) Curing the surface to hardness.

It will be appreciated that these steps can be readily conducted in the order listed above or in a different order, as illustrated by Table 1.

TABLE 1

| Order of Steps (after coating substrate) | Description |
| --- | --- |
| (a), (b), (c) and (d) | Age; contact planarization object; separate from object; and then cure. |
| (a), (d), (b) and (c) | Age; cure; contact planarization object; and then separate from object. |
| (b), (a), (d) and (c) | Contact planarization object; allow aging to continue; cure; separate from object. (with application of e.g., S.O.G. composition pre-mixed/treated with gelling agent and, curing in the press). |
| (b), (c), (a) and (d) | Contact planarization object; separate from object; allow aging to continue; cure (with application of e.g., S.O.G. composition pre-mixed or pre-treated with gelling agent). |

In one option, a fluid that includes a silicon-based dielectric precursor also includes viscosity enhancers to permit contact with a planarization object and/or a removable, non-stick film, before significant viscosity enhancement by the aging process has taken place.

In another option, a protective liner and/or additional protective coating, e.g, is applied onto the substrate surface, prior to application of the silica dielectric precursor(s).

At an appropriate processing stage after the substrate is coated, while the coating remains plastic and able to be impressed with a flat surface while retaining the capacity to form a desired nanoporous structure, the coated substrate is transferred to a press machine, a roller machine, and/or any other art-known device for impressing a flat surface onto the film-coated substrate. There, a planarization object, i.e., an object having at least one surface having the necessary capacity to impress a planar or any other desired pattern onto the surface of the coating, such as an optical flat, is contacted, preferably under pressure, with the coating on the substrate.

Preferably, as mentioned supra, a release layer, such as a non-stick fluorocarbon surface or other art-known material of similar properties, is positioned between the planarization object contact surface and the coating to be planarized. For convenience, the non-stick release material can be a non-stick film that can be separately applied and separately removed from the planar object contact surface and the planarized coating. In addition, if the substrate is only being coated on one side at a time, a protective layer of a soft, i.e., compliant, material is placed under the other side of the substrate to protect it from damage.

It will also be appreciated that the pressure and duration of the planarization step will vary, depending on the properties of the dielectric coating, including the type of precursor material, viscosity of the coating, coating thickness and the degree of aging and/or curing, if any, that has taken place at the start of the pressing.

In a preferred aspect of the invention, the applied pressure ranges from about 0.1 MPa to about 1 GPa. More preferably, the applied pressure ranges from about 0.2 MPa to about 10 MPa (pressure units in Pascals). The duration of the pressing step preferably ranges from about 10 sec to about 30 minutes, and more preferably, from about 30 sec to about 10 minutes.

In a further aspect of the invention, the coating to be planarized can be exposed to vacuum prior to pressing to speed removal of vapors and/or dissolved gases in order to minimize undesirable bubble formation. Alternatively, the pressing step can be conducted in vacuum. Optionally, the film can be heated and cured while still under pressure in the press or after removal from the press.

B. Apparatus for Planarizing and/or Embossing Patterns Onto an Applied Dielectric Film The invention provides a compression tool for planarizing and/or embossing dielectric films on substrates. Of course, the artisan will appreciate that the inventive compression tool may be applied and controlled by any suitable art-known press or embossing apparatus, including, e.g., an arbor press, a hydraulic press, a pneumatic press, a moving cross-head press, to name but a few.

Generally, the inventive apparatus includes an object with at least one face having a suitable topography in negative image to the desired pattern to be impressed or embossed onto a dielectric film. Certain embodiments are preferred. With reference to FIG. 1, a vented compression tool (1) is illustrated. As previously described, a precursor, for the desired dielectric film (10) is applied onto the working surface of a suitable substrate (20), e.g., a silicon wafer or die, or the like, as described in detail, supra. The substrate is supported on its opposite surface with a support. This is preferably a compliant support (30), e.g., an elastic and compressible polymer or copolymer pad or sheet that will elastically deform, as necessary, to compensate for a mall amount of flexure of the substrate and to eliminate the effects of minor substrate deformities, e.g., variations in a substrate wafer's total thickness variation (TTV). A rigid support (40) optionally underlies and/or backs the compliant support.

The compliant support of the instant embodiment (30) is preferably a polymer pad of sufficient thickness to be both compliant and supportive. Suitable compliant materials include, for instance, solid or void-filled elastomers, e.g., a solid pad of an elastic polymer or an elastomer bladder pressurized with a fluid, gas or liquid. In addition, the compliant support can comprise purely viscous materials such as "pitch." Pitch, which is used extensively as a lapping surface in optical polishing processes, is useful because of its viscous properties. One useful property of pitch-type materials is that their viscosity can be regulated by temperature controls the viscosity of the pitch-type materials.

The compression tool is then forced into contact with the applied film of dielectric precursor (50), optionally before, during or after aging/gelation, by any art standard press machine, e.g., an arbor press, a hydraulic press, a pneumatic press, a moving cross-head press and/or combinations or variations of such types of presses. As a con sequence, the topography of the compression tool contact surface is transferred to the dielectric film, thus effecting a one-step planarization or embossed pattern.

The dielectric film is prevented from adhering to the working surface of the compression tool by a non-stick release material that is optionally affixed or coated on the working surface of the compression tool (60), or applied as a sheet or membrane over the dielectric film before compression. As previously mentioned, this can be a Teflon™ or similar type of release material.

While the compression tool (1) is in contact with the dielectric film, gases or vapors released by ongoing evaporative or gelation processes may be generated. Without some outlet for removing or venting such gases or vapors, bubbles are likely to be impressed into the film surface. Thus, any generated gases or vapors are vented via the purge inlet(s) (70). Once the film is planarized or impressed with a desired pattern, the compression tool is removed from the wafer surface, completing the process.

Figure 2:
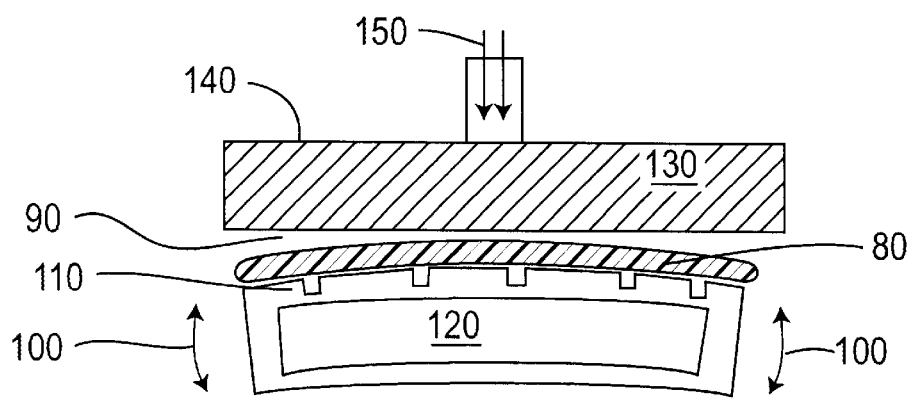
FIG. 2 illustrates a dielectric film coating on a substrate positioned between a compression tool and a compliant support, where the substrate and film have a convex surface and the compression tool is positioned to make initial contact at the center of the film.

In a second preferred embodiment, as illustrated by FIG. 2, the substrate (80) and dielectric film (90) have a convex surface. The convex shape is imposed by a compliant support (100) that has a vacuum "chuck" (110) on its upper surface that holds the substrate or wafer firmly in place. This chuck is then flexed into a dome shape. Any suitable mechanical pressure can be applied to create this flexure. Preferably, this is accomplished by raising the internal fluid pressure within a pressure compartment (120), e.g., an inflatable bladder or one or more pistons, that are positioned within the compliant support.

In one optional embodiment, the convex shaped substrate and dielectric film are forced against the compression tool by continuing to raise the pressure in the compliant compartment until full contact is achieved.

With the substrate, and its dielectric film coating in a convex shape, initial contact with the planar compression tool (130) occurs at the high point of the "dome" (140). Further application of force (150) through the compression tool causes an increasingly larger contact area between the compression tool and the film. With continuing application of progressively increased force the entire film comes into contact with the compression tool. This gradual radial increase in the area of contact forces any vapors or gases out and substantially reduces entrapment of vapor or gas bubbles. Such bubbles would otherwise introduce a surface defect.

Figure 3:
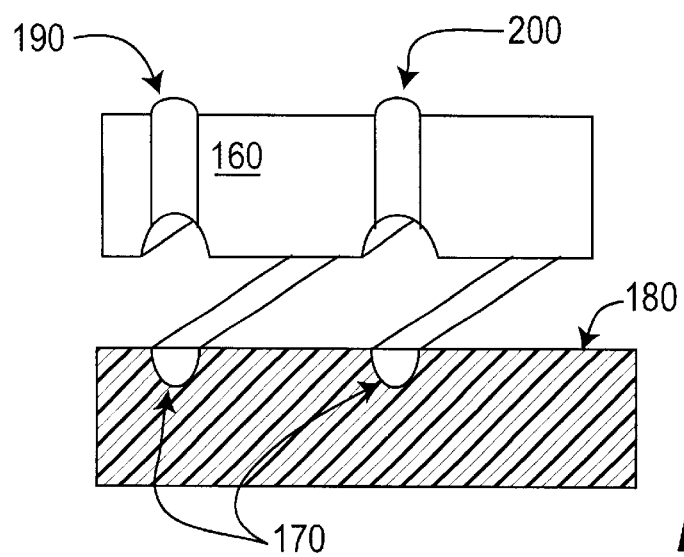
FIG. 3 illustrates the relationship between an individual die bearing scribe lines and purge channels in the press and compression tool purge channels matching the inter-substrate scribe lines.

FIG. 3 provides a close-up view of the circled aspect identified as "A" in FIG. 2. Thus, FIG. 3 illustrates an embodiment of the invention wherein the compression tool (160) is crafted so that individual scribe lines (170) on the substrate (180) correspond to purge inlets or vents (190) passing through the compression tool, as well as purge channels (200)—e.g., matching the inter-die scribe line—running along the face of the compression tool. These purge inlets are connected to purge channels in the tool face, as is shown in the circled detail (A) of FIG. 2. The purge vents can be arranged at random locations, but are preferably connected to the purge channels on the compression tool face. The purge channels are generally preferably located along the wafer scribe lines that separated the individual die of integrated circuits wafer. The purge channels can mirror the "cris-cross" appearance of the wafer scribe lines. The purge channels and vents facilitate numerous processing steps, including removal or application of gases, vapors or liquid solutions to the substrate during compression. A compliant support, analogous to that shown in FIG. 1, is optionally employed.

Figure 4:
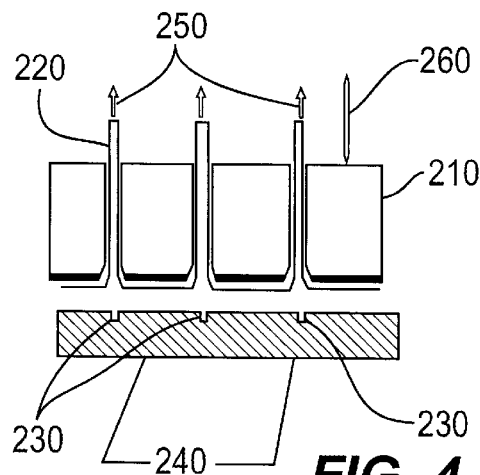
FIG. 4 illustrates the operational relationship between purge inlet structure and the purge channels in a substrate and compression tool in removing vapors or gases from the pressed dielectric film.

In a further embodiment, as illustrated by FIG. 4, the compression tool (210) is crafted so that purge vents (220) correspond to purge channels (230) in the substrate or die (240). In this embodiment, the combinations of purge vents and purge channels are useful for removal of excess liquid precursor (250) from the substrate surface as compression force (260) is applied. Reducing the thickness of a relatively thin liquid film over a large area requires either an unacceptable amount of force, or an unacceptable amount of time. This "squeeze film" effect is greatly reduced by reducing the area that entraps the liquid.

An individual die is on the order of 10% of the substrate (wafer) diameter. Purge channels arranged at the scribe lines would allow planarization to occur more quickly, e.g., approximately twice as fast relative to a solid, non-channeled compression tool. A compliant support, analogous to that shown in FIG. 1, is optionally employed.

Figure 5:
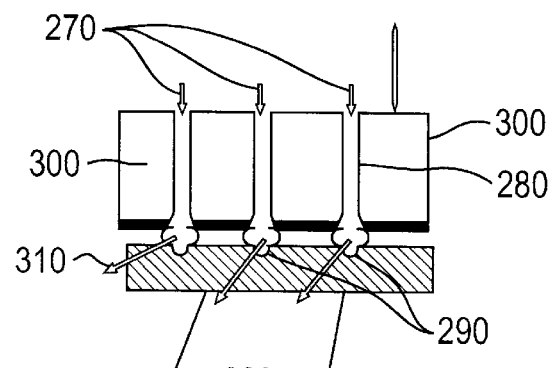
FIG. 5 illustrates the injection of vapors, gases etc. through vent channels.

In addition, the purge vents and channels can also be used to inject gasses or liquids into the area of the film being planarized, as illustrated by FIG. 5. Liquid and/or gaseous solvents (270) are pushed through the purge vents (280) and channels or scribe lines (290) after the compression tool (300) has made complete contact with the liquid film precursor, but before the film hardens. The solvent is employed, e.g., to remove unwanted liquid film precursor material from the scribe area (adjacent to the channels or scribe lines). Only a limited quantity of the solvent affects the planarized area (over the die, 320) because of the strong meniscus that can form at the junction of the die edge and the compression tool. This meniscus can limit solvent migration onto the die area where the film has been planarized or a pattern has been embossed. Additionally a combination of suction and positive pressure through the purge vents and channels is optionally used to enhance film planarization.

Simply by way of example, upon initial contact of the compression tool with the liquid film precursor, a vacuum can be employed to scavenge excess liquid precursor from the interface of the die and compression tool. After the desired film thickness is achieved, a combination of liquid and gaseous solvents is then pushed thought the purge vents and channels to remove unwanted liquid film precursor from the scribe lines, as well as the compression tool page vent and purge channels. Additional force can be applied between the compression tool and the compliant substrate to prevent this positive pressure from prematurely separating the compression tool from the film. Once the film has been hardened or cured, the positive pressure (in the purge vents and channels) assists in separating the compression tool from the planarized film.

Figure 6:
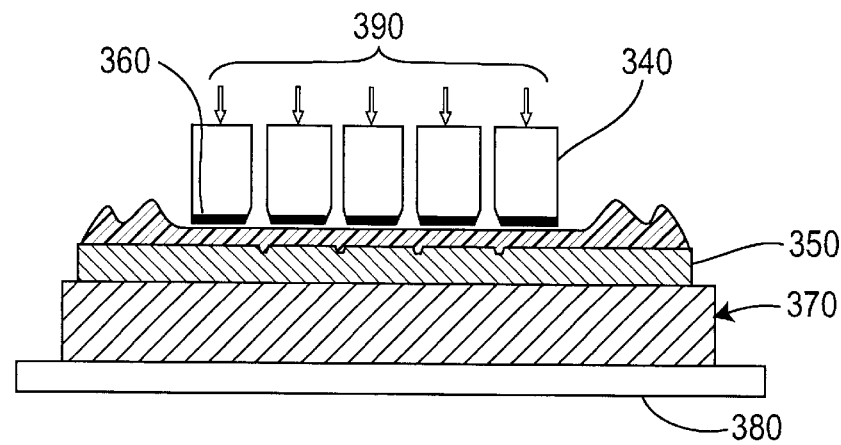
FIG. 6 illustrates an array of compression tools that are smaller in size than the substrate, so as to impress multiple patterns or planar regions into a dielectric coating on different parts of a single substrate.

In a fifth preferred embodiment, as illustrated by FIG. 6, the compression tool is formed of a coordinated array of small compression tools (340) that are each smaller in cross-section diameter than the diameter of the substrate (350) to match the size and shape of individual dies on a large scale substrate, and that are each coated with a non-stick release material (360) as described above. Depending on the desired IC product, the coordinated array is optionally formed of any number of small compression tools, ranging in number, for example, from 2 to about 20, or more. More preferably, the coordinated array is optionally formed of 2 to about 10 small compression tools.

An elastic or pitch-type compliant support (370) as described above for FIG. 1 is also optionally employed on the opposite side of the substrate, optionally resting on a rigid support (380). The smaller compression tools allow for large variations of substrate profile across the wafer (TTV), as well as allowing a finer degree of planarization on the individual die where the planarization is required. In addition, smaller compression tools are simpler and less expensive than a large wafer sized compression tool, and can be prepared to have a surface that is much flatter and smoother than that possible on a larger tool. This will give a greater degree of planarization to the film on the individual die.

The individual small compression tools are optionally ganged to a single press machine, each being raised, lowered and applying compression force (390) simultaneously and with approximately equal force, or alternatively, one or more of these compression tools can be operatively linked to a separate press machine, e.g., a hydraulic, electro-magnetic or gas-operated piston, chain or roller mechanism(s), with one or more separate controls. In this arrangement, the compression force depth of compression and duration of compression is customized for each die on the substrate to conform to the desired integrated circuit or device.

Figure 7:
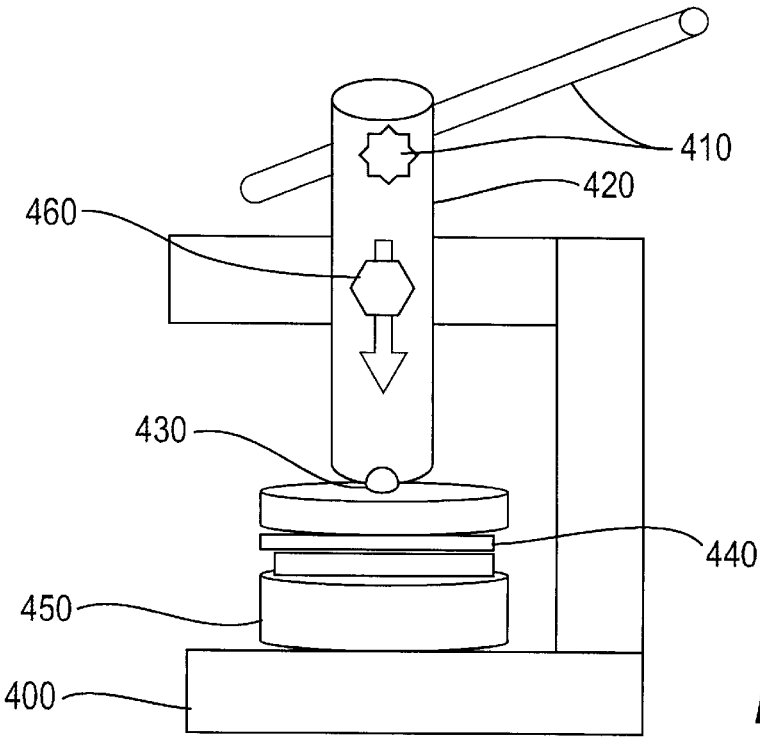
FIG. 7 illustrates one embodiment of the inventive apparatus placed in an arbor press.

Simply by way of illustration and without limitation, FIG. 7 illustrates one embodiment of the inventive apparatus in an simple arbor press. The frame (400) supports a mechanical linkage (410) by which force is applied through a piston (420) to a rotatable ball joint, which allows for even application of the pressure to a compression tool (430), having the topography on its working face, that is applied to a film-coated wafer (440), resting on a support (450). A pressure gauge (460) provides an indication of the force applied to the wafer. A release material (not illustrated) between the worlding face of the compression tool and the film-coated wafer, allows for release once the impression is complete.

The following nonlimiting examples serve to illustrate the invention.

EXAMPLE 1

This example illustrates a process wherein a precursor is mixed with an aging agent, the mixture was then spin deposited onto a surface of a silicon wafer having a pattern of metal wiring on that surface. The coated wafer was then placed in a press with an optical flat having a release layer in contact with the coating.

The base materials, including a dielectric precursor and an aging agent, were mixed for 30 sec before the substrate was spin coated onto test wafers of 4 and 6 inches in diameter. The films were spun on a Solitec™ machine (Solitec Wafer Processing, Inc., San Jose, Calif.) using manual dispense with a spin speed that ranged from 1000 to 4000 rpm. The precursor was a partially hydrolyzed and partially condensed fluid alkoxysilane composition (available from Honeywell International Inc., Advanced Microelectronic Materials Sunnyvale, California as Nanoglass® K2.2), prepared with 21.6% EtOH mixed with 8.75% monoethanolamine ("MEA") in EtOH. MEA is a nonvolatile base aging agent. The ratio of precursor to the base ranges from about 1:0.34 to about 1:0.26.

The process can be summarized as follows:
1) mix Nanoglass® precursor with MEA (defined as time 0).
2) deposit and spin film onto silicon wafer.
3) put wafer into press and apply Teflon™ sheet (90 to 210s after time 0).
4) leave in press for 10 min.
5) return to spin coater, perform solvent exchange using HMDZ/3-pentanone, spin dry.
6) hot plate bake at 175° C. and 320° C. for 1 min each.
7) furnace cure at 400° C. for 30 min.

After mixing (time zero), a flat Teflon™ sheet was applied onto the coated wafer, and the combination was put into a press for a time period ranging from about 90 to about 210 secs after the base material was mixed. The press was set at a pressure ranging from about 25 to about 60 psi. The pressed substrates were removed from the press and solvent exchanged using HMDZ/3-pentanone, and then baked at 175° C. and cured at 400°0 C.

EXAMPLE 2

This example illustrates a process wherein a precursor is spin deposited onto a silicon wafer, the wafer is then aged in a chamber for a given period, planarized by pressing the aged (e.g., gelled) nanoporous silica dielectric film with a vented, flat Teflon™-coated compression tool as shown by FIG. 1.

The aging process in the chamber is as follows. The chamber is evacuated, dosed with water vapor to various pressures for a fixed amount of time, dosed with ammonia gas to a higher pressure for a fixed amount of time, evacuated once again for a fixed time, then the pressure in the chamber is brought to ambient by backfilling with an inert gas.

A precursor is made by mixing, while stirring, 61 ml tetraethoxysilane, 61 ml tetraethylene glycol, 4.87 ml deionized water, and 0.2 ml 1M nitric acid (Conc. $HNO_3$ diluted to 1M. This mixture was then refluxed while stirring continuously for 1.5 hours, then cooled. A portion of this precursor is diluted 55% by weight with ethanol while stirring.

Approximately 1.5 ml of this diluted precursor is deposited onto a 4 inch silicon wafer on a spin chuck, and spun on at 2500 rpm for 10 seconds. Two films are deposited in this way. Each film is placed into an aging chamber, which is then evacuated to 1 mbar (0.76 torr) in 30 seconds. Water vapor is dosed into the chamber at a pressure ranging from about 7 mbar (5.32 torr) to about 14 mbar (10.64 torr) (from a reservoir of deionized water at temperatures ranging from 0° C. to about 25° C., respectively); the wafers are left in this pressure range of water vapor for 30 seconds.

Ammonia gas is dosed into the chamber to a pressure ranging from about 855 mbar (649.8 torr) to about 809 mbar (614.84 torr); the wafers are left for 1 minute at this pressure range. The chamber is evacuated for 30 seconds to 2 mbar (1.52 torr), then immediately backfilled with air to ambient pressure.

The wafers are removed from the chamber and each is placed onto a compliant pad in a press. A flat, vented, compression tool according to FIG. 1, having a Teflon™ coating on the working surface is contacted with each coated wafer for a time period ranging from about 90 to about 210 secs. The press is set at a pressure ranging from about 25 to about 60 psi. The pressed substrates are removed from the press and placed on a hotplate at 90° C. for 2 minutes, followed by an oven bake at 175° C. for 3 minutes, then another oven bake at 400° C. for 3 minutes. The wafers are removed from the press, and after cooling are measured by ellipsometry for thickness and refractive index. Refractive index can be linearly correlated to the film porosity. A refractive index of 1.0 is 100% porosity and 1.46 is dense, 0% porosity silica. The wafers are also inspected by scanning electron microscopy for surface planarity and regularity. The results of the measurements of the nanoporous dielectric film confirm that the index of refraction and the thickness are within acceptable limits, and the surfaces of the dielectric films are planar.

EXAMPLE 3

The processes of Example 1 are repeated, except that the wafers are heated and dried before being placed in the press.

EXAMPLE 4

The processes of Example 1 are repeated, except that the wafers are heated at 90° C. for 2 minutes while still in the press by the application of heat to the plates of the press. The wafers are then removed from the press for the final oven back as described by Example 1.

EXAMPLE 5

The processes of Example 1 are repeated, except that the press is set at a pressure ranging from about 10 to about 30 psi.

EXAMPLE 6

This example illustrates a process wherein a precursor is spin deposited onto a silicon wafer, the wafer is then aged in a chamber for a given period and then dried. The aging process in the chamber is as follows. The chamber is evacuated, dosed with water vapor to a fixed pressure for a fixed amount of time, dosed with ammonia gas to various higher pressures for a fixed amount of time, evacuated once again for a fixed time, then the pressure in the chamber is brought to ambient by backfilling with an inert gas. A precursor is made by mixing, while stirring, 61 ml tetraethoxysilane, 61 ml tetraethylene glycol, 4.87 ml deionized water, and 0.2 ml 1M nitric acid. This mixture is then refluxed while stirring continuously for 1.5 hours, then cooled. A portion of this precursor is diluted 55% by weight with methanol while stirring. Approximately 1.5 ml of this diluted precursor is deposited onto a 4 inch silicon wafer on a spin chuck, and spun on at 2500 rpm for 10 seconds. Three films are deposited in such a way. Each film is placed into an aging chamber, which is evacuated to 1 mbar (0.76 torr) in 30 seconds. Water vapor is dosed into the chamber to 15 mbar (11.4 torr) (from a reservoir of deionized water at 25° C.) and the wafers are left for 30 seconds at this pressure. Ammonia gas is dosed into the chamber to a pressure of 270 mbar (205.2 torr) for the first wafer, 506 mbar (384.56 torr) for the second wafer, and 809 mbar (614.84 torr) for the third. The wafers are left at these pressures for 3 minutes. Next the chamber is evacuated for 30 seconds to 2 mbar (1.52 torr), then immediately backfilled with air back to ambient pressure.

The wafers are removed from the chamber and each is placed onto a compliant pad in a press. A flat, vented compression tool according to FIG. 1, having a Teflon™ coating on the working surface is contacted with the coated wafer in the press for a time period ranging from about 200 to about 400 secs. The press is set at a pressure ranging from about 40 to about 100 psi. The pressed substrates are removed from the press and placed on a hotplate at 90° C. for 2 minutes, followed by an oven bake at 175° C. for 3 minutes, then another oven bake at 400° C. for 3 minutes. The wafers are then removed and after cooling are measured by ellipsometry for thickness and refractive index. The wafers are also inspected by scanning electron microscopy for surface planarity and regularity. The results of the measurements of the nanoporous dielectric film confirm that the index of refraction and the thickness are within acceptable limits, and the surfaces of the dielectric films are planar.

EXAMPLE 7

This example demonstrates that a catalyzed nanoporous silica precursor deposited via codeposition can be aged in ambient clean room humidity to yield low density uniform thin films that can be readily planarized.

The precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously then heated to 80° C. and refluxed for 1.5 hours to form a solution. After the solution is allowed to cool, it is diluted 21.6% by weight with ethanol to reduce the viscosity. The catalyst used was monoethanolamine. It is diluted 8.75% by weight in ethanol to reduce viscosity and increase the gel time.

A dual syringe pump is used for deposition. The dual syringes are assembled using a 5 ml and 20 ml syringe, respectively, which are each attached to a fluid delivery tube. The two tubes each terminate so that the fluid streams from each will mix and commingle when the syringes are simultaneously pumped.

The precursor is loaded into the larger syringe and catalyst is loaded into the smaller syringe. 1 ml of precursor and 0.346 ml of catalyst are simultaneously pumped at a rate of 10 ml/min. The fluid streams meet at a 90° angle to form one stream, which in turn flows onto the substrate. The wafer is spun at 2500 rpm for 30 seconds after deposition. The film is placed in a wafer carrier cartridge in the clean room ambient humidity that is set at 35%. The film is then aged for 15 min.

The film is then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film is then spun dry at 1000 rpm for 5 seconds.

The wafers are removed from the chamber and each is placed onto a compliant pad in a press. A flat, vented, compression tool according to FIG. 1, having a Teflon™ coating on the working surface is contacted with each coated wafer for a time period ranging from about 200 to about 400 secs. The press is set at a pressure ranging from about 40 to about 100 psi. The pressed substrates are removed from the press and then heated at elevated temperatures for 1 min. at 175° C. and 320° C., respectively, in air. The film is characterized by ellipsometry to determine the refractive index and thickness. In addition, the hydrophobicity is tested by placing a water drop onto the film to determine the contact angle. The wafers are also inspected by scanning electron microscopy for surface planarity and regularity. The results of the measurements of the nanoporous dielectric film confirm that the index of refraction and the thickness are within acceptable limits, that the films are substantially hydrophobic, and that the surfaces of the produced dielectric films are planar.

EXAMPLE 8

The processes of Example 7 are repeated, except that the press is set at a pressure ranging from about 10 to about 30 psi.

EXAMPLE 9

The processes of Example 2 are repeated, except that the compression tool as shown by FIG. 2 is employed where the substrate and coating are pushed into a convex shape by a compliant device powered by a gas-filled bladder.

EXAMPLE 10

The processes of Example 2 are repeated, except that the compression tool is vented as shown by FIG. 3 and a vacuum is applied through the purge inlets to remove excess gasses or vapors during the compression period.

What is claimed is:

1. A method of planarizing or patterning a dielectric film on a substrate comprising
  (a) applying a dielectric film precursor to a substrate;
  (b) planarizing or patterning said dielectric film in an apparatus comprising
    (i) a press for applying contact pressure to a compression tool,
    (ii) a compression tool having a working face that is planar or patterned, wherein said compression tool is operably connected to said press,
    (iii) a controller for regulating the position, timing and force applied to said dielectric film by said press,
    (iv) a support positioned adjacent said substrate and opposite from the film to be contacted with the compression tool;
  by applying sufficient pressure to transfer an impression of the working face of the compression tool to the coating;
  (c) gelling said dielectric film before, during or after step (b);
  (d) curing said dielectric film.

2. The method of claim 1 wherein said press is selected from the group consisting of an arbor press, a hydraulic press, a pneumatic press, a moving cross-head press and combinations thereof.

3. The method of claim 1 wherein said compression tool is an object selected from the group consisting of an optical flat, an object with a planar working surface, an object with a patterned working surface, a cylindrical object with a working surface that will emboss a dielectric film when said cylindrical object is rolled over said dielectric film, and combinations thereof.

4. The method of claim 1 that comprises a coordinated array of at least 2 compression tools that arc smaller in cross-section diameter than the substrate diameter, so as to impress multiple patterns or planar regions into a dielectric coating on different parts of a single substrate.

5. The method of claim 1 wherein said coordinated array of compression tools comprises from 2 to about 20 compression tools.

6. The method of claim 5 wherein said vent comprises one or more purge inlets opening on the working face of said compression tool and passing completely through said compression tool, one or more purge channels running along the working face of said compression tool, and said purge channels are operably connected to said purge inlets.

7. The method of claim 6 wherein said purge inlets are operably connected to a gas or vapor collection system.

8. The method of claim 6 wherein said purge inlets are operably connected to a gas or vapor source for bringing a gas or vapor into contact with said dielectric film before, during or after compression.

9. The method of claim 1 wherein said support is a compliant support.

10. The method of claim 6 wherein said compliant support is selected from the group consisting of compressible polymer, a compressible copolymer, a viscous material, a polymer bladder filled with a pressure regulated hydraulic fluid, and combinations thereof.

11. The method of claim 1 wherein said support comprises a workpiece holder for holding said substrate in a fixed position during compression.

12. The method of claim 11 wherein said workpiece holder comprises a vacuum chuck.

13. The method of claim 1 wherein the substrate and film have a convex surface and the compression tool is positioned in the apparatus to make initial contact at the center of the film as the press advances the compression tool towards the substrate and film.

14. The method of claim 1 wherein said compression tool has a working face that is capable of transferring a planar or patterned impression to said dielectric film.

15. The method of claim 1 wherein said compression tool comprises at least one vent for transporting vapors or gases to or from the working face of the compression tool compression, said vent comprising at least one opening on the working surface of said compression tool, where said opening connects to a conduit through said compression tool.

16. The method of claim 15 wherein said conduit through said compression tool connects to atmosphere or to a gas or vapor collection system.

17. The method of claim 15 wherein said conduit through said compression tool connects to a source of pressurized gas.

18. The method of claim 1 wherein said compression tool is coated with a nonstick release material.

19. The method of claim 1 further comprising a substrate with a dielectric film thereon, positioned under said compression tool and supported by said support.

20. The method of claim 1 wherein the dielectric film precursor is selected to form a nanoporous silica dielectric film.

21. The method of claim 20 wherein the pressure of step (b) is regulated to transfer an impression of the working face of the compression tool without substantially impairing pore formation of the nanoporous silica dielectric film.

22. A dielectric film on a substrate that is planarized or patterned by the method of claim 1.

23. A planarized or patterned dielectric silica coating on a substrate formed by a process comprising: applying a composition that comprises a silicon-based precursor onto a substrate to form a coating on said substrate, and conducting the following steps:
  (a) gelling or aging the applied coating,
  (b) contacting the coating with a planarization object with sufficient pressure to transfer an impression of the object to the coating without substantially impairing formation of desired nanometer-scale pore structure,
  (c) separating the planarized coating from the planarization object,
  (d) curing said planarized coating;
wherein steps (a)–(d) are conducted in a sequence selected from the group consisting of
  (a), (b), (c) and (d);
  (a), (d), (b) and (c);
  (b), (a), (d) and (c);
  (b), (a), (c) and (d); and
  (b), (c), (a) and (d).

* * * * *